US009354527B2

(12) United States Patent
Sato et al.

(10) Patent No.: US 9,354,527 B2
(45) Date of Patent: May 31, 2016

(54) OVERLAY DISPLACEMENT AMOUNT MEASURING METHOD, POSITIONAL DISPLACEMENT AMOUNT MEASURING METHOD AND POSITIONAL DISPLACEMENT AMOUNT MEASURING APPARATUS

(71) Applicant: Kabushiki Kaisha Toshiba, Minato-ku (JP)

(72) Inventors: Hidenori Sato, Yokohama (JP); Nobuhiro Komine, Nagoya (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 363 days.

(21) Appl. No.: 14/075,044

(22) Filed: Nov. 8, 2013

(65) Prior Publication Data
US 2015/0036717 A1  Feb. 5, 2015

Related U.S. Application Data

(60) Provisional application No. 61/861,098, filed on Aug. 1, 2013.

(51) Int. Cl.
*G03F 7/20* (2006.01)
*G03F 9/00* (2006.01)

(52) U.S. Cl.
CPC ........ *G03F 7/70633* (2013.01); *G03F 7/70483* (2013.01); *G03F 9/7003* (2013.01)

(58) Field of Classification Search
CPC  G03F 7/70633; G03F 7/70483; G03F 9/7003
USPC .................................................. 430/22, 30
See application file for complete search history.

(56) References Cited

U.S. PATENT DOCUMENTS

| 5,989,761 A | * | 11/1999 | Kawakubo | .......... G03F 7/70358 430/22 |
| 6,251,745 B1 | * | 6/2001 | Yu | ........................ G03F 7/70633 257/E21.53 |
| 7,483,156 B2 | * | 1/2009 | Cho | .................... G03F 7/70633 356/635 |

FOREIGN PATENT DOCUMENTS

| JP | 8-288206 | 11/1996 |
| JP | 2008-76157 | 4/2008 |
| JP | 2010-266687 | 11/2010 |
| JP | 2010-287762 | 12/2010 |
| JP | 2012-79735 | 4/2012 |
| JP | 2012-84793 | 4/2012 |

* cited by examiner

*Primary Examiner* — Christopher Young
(74) *Attorney, Agent, or Firm* — Oblon, McClelland, Maier & Neustadt, L.L.P.

(57) ABSTRACT

In an overlay displacement amount measuring method according to an embodiment, a temperature distribution of a substrate during a pattern forming process and a temperature distribution of the substrate during a measuring process for measuring a positional displacement amount between patterns on the substrate by an electron microscope are measured. An expansion/contraction amount of the substrate between two processes is calculated based upon the two temperature distributions, and the positional displacement amount is corrected based upon the expansion/contraction amount. An overlay displacement amount between the pattern and a pattern formed on a layer different from the pattern is measured by an optical measuring apparatus, and the overlay displacement amount is corrected based upon the corrected positional displacement amount.

15 Claims, 10 Drawing Sheets

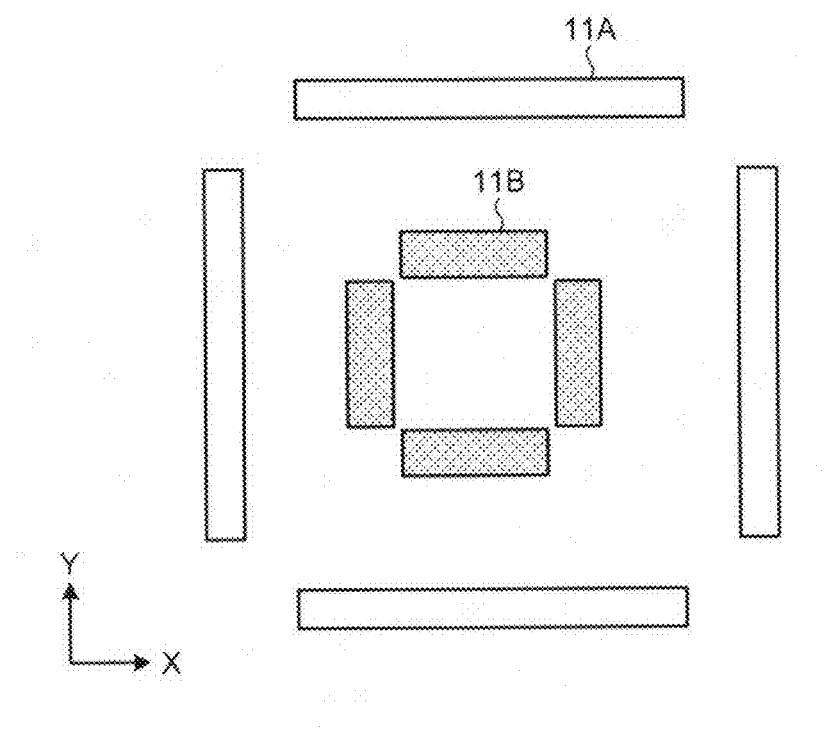

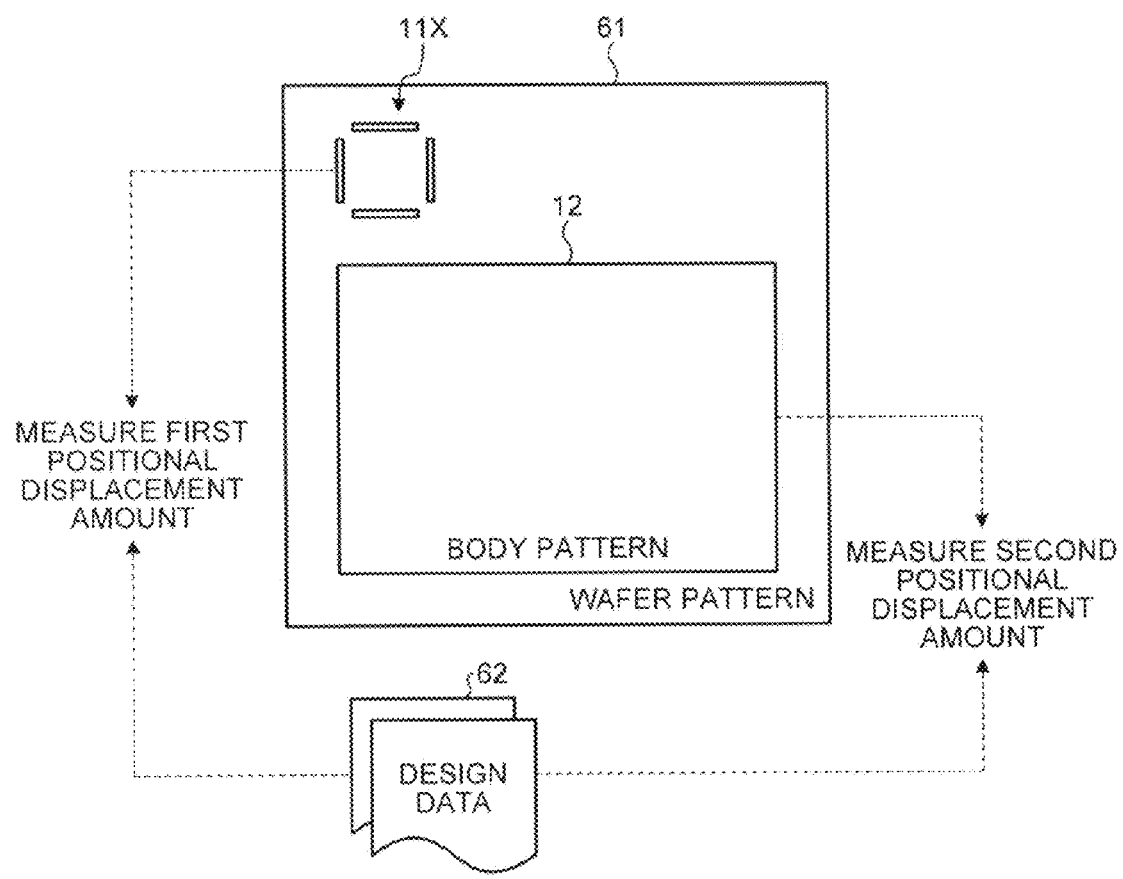

OVERLAY DISPLACEMENT AMOUNT MEASURING METHOD, POSITIONAL DISPLACEMENT AMOUNT MEASURING METHOD AND POSITIONAL DISPLACEMENT AMOUNT MEASURING APPARATUS

CROSS-REFERENCE TO RELATED APPLICATIONS

This application is based upon and claims the benefit of priority from U.S. Provisional Application No. 61/861,098), filed on Aug. 1, 2013; the entire contents of which are incorporated herein by reference.

FIELD

An embodiment herein relates generally to an overlay displacement amount measuring method, a positional displacement amount measuring method, and a positional displacement amount measuring apparatus.

BACKGROUND

A technique of manufacturing a semiconductor device, provided with a semiconductor element such as a transistor essentially includes a technique of forming a fine pattern for enhancing integration. Recently, the improvement in overlay accuracy between layers has become significant with the further microfabrication of the pattern.

A fine body pattern (device pattern) is not resolved by an optical measuring apparatus. Therefore, the overlay displacement amount between layers has been measured by using an alignment mark formed separate from the device pattern. During the measurement of the overlay displacement amount described above, the overlay displacement amount measured by using the alignment mark and the overlay displacement amount of the body pattern (circuit pattern) might be different from each other with the more microfabrication of the pattern.

A method of measuring the overlay displacement amount by using an SEM (Scanning Electron Microscope) having high resolution has been developed. This measuring method includes two methods, which are a method of directly measuring the overlay displacement amount and a method of indirectly measuring the overlay displacement amount.

In the former method, after a lower layer and an upper layer are both formed, the overlay between the body patterns is directly measured by using an SEM image captured from above the upper layer. In this method, an electron beam has to pass through the upper layer. Therefore, it is difficult to set the observation condition of the SEM, and further, a substrate is significantly damaged.

In the latter method, the positional displacement amount of the alignment mark from the body pattern after the lower layer is formed and the same positional displacement amount after the upper layer is formed are respectively measured by using the SEM image. The overlay displacement amount between the alignment marks measured by the optical measuring apparatus is added to the respective positional displacement amounts, whereby the overlay displacement amount of the body patterns is indirectly measured.

In the latter method, the positional relationship between the alignment mark and the body pattern cannot be measured with high accuracy, since the positional relationship between the alignment mark and the body pattern is changed due to the thermal expansion of the substrate. Accordingly, the latter method entails a problem that the overlay displacement amount between the upper layer and the lower layer cannot accurately be measured. Consequently, an accurate measurement of the overlay displacement amount between the upper layer and the lower layer has been demanded.

BRIEF DESCRIPTION OF THE DRAWINGS

FIG. 4 is a view illustrating an example of a structure of an alignment mark on a lower layer and a structure of an alignment mark on an upper layer.

FIG. 5B is a view for describing a concept of a positional displacement amount measuring process between a wafer pattern and design data.

DETAILED DESCRIPTION

According to the embodiment, an overlay displacement amount measuring method is provided. In the overlay displacement amount measuring method, a first temperature distribution of a substrate during a process (first process) of forming a first pattern on the substrate is measured. A first positional displacement amount between the first patterns is measured by a first electron microscope. A second temperature distribution of the substrate in a process (second process) of measuring the first positional displacement amount is measured. Thereafter, a first expansion/contraction amount of the substrate between the first process and the second process is calculated based upon the first temperature distribution and the second temperature distribution, and the first positional displacement amount is corrected based upon the first expansion/contraction amount. An overlay displacement amount between the first pattern and a second pattern, which is formed on a layer different from the first pattern, is measured by a first optical measuring apparatus. The overlay displacement amount is corrected based upon the corrected first positional displacement amount.

The overlay displacement amount measuring method, the positional displacement amount measuring method, and the positional displacement amount measuring apparatus will be described in detail with reference to the accompanying drawings. Note that these embodiments do not limit the present invention.

Embodiment

Figure 1:
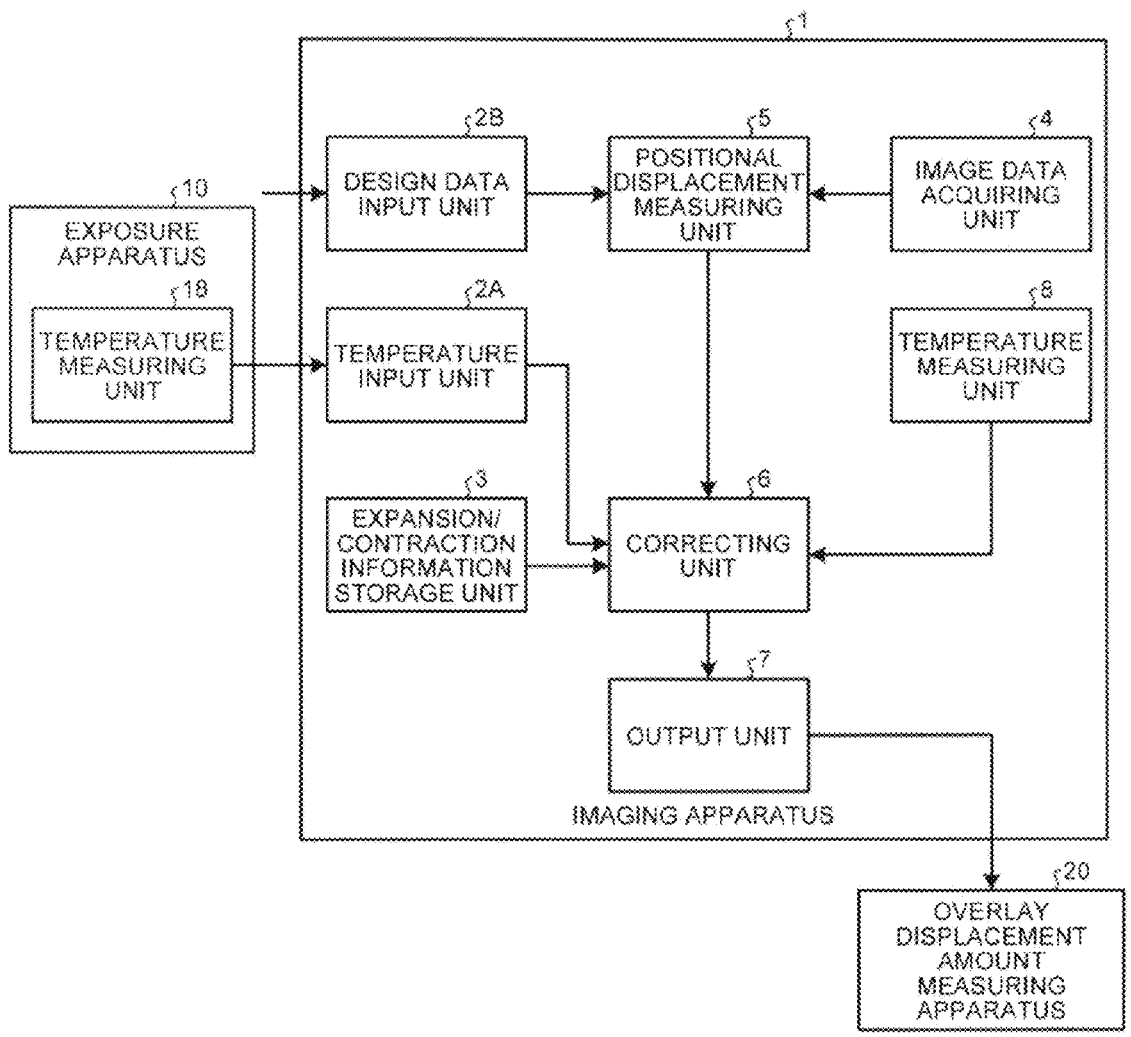
FIG. 1 is a block diagram illustrating a configuration of an imaging apparatus according to an embodiment.

FIG. 1 is a block diagram illustrating a configuration of an imaging apparatus according to an embodiment. An SEM-OL (overlay) measuring system is for measuring an overlay displacement amount between a pattern (lower pattern) on a lower layer and a pattern (upper pattern) on an upper layer, and includes an imaging apparatus 1, an exposure apparatus 10, and an overlay displacement amount measuring apparatus 20.

The imaging apparatus 1 captures an image on a wafer pattern (pattern on a substrate) formed on a substrate such as a wafer WA (not illustrated). The imaging apparatus 1 is an electron microscope using an electron beam, and it is, for example, an SEM (Scanning Electron Microscope). The imaging apparatus 1 has a function as a positional displacement amount measuring apparatus, and measures an overlay displacement amount between the lower pattern and the upper pattern formed on the wafer WA.

The imaging apparatus 1 according to the present embodiment measures the positional displacement amount between the wafer patterns (between a later-described alignment mark and a body pattern) based upon a temperature (wafer temperature) of the wafer WA during the exposure and a temperature (wafer temperature) of the wafer WA during the measurement of the positional displacement amount. The imaging apparatus 1 is connected to the exposure apparatus 10 and the overlay displacement amount measuring apparatus 20.

The exposure apparatus 10 forms a wafer pattern on the wafer WA through the exposure process to the wafer WA. The wafer pattern that is a subject whose overlay displacement amount is to be measured may be a resist pattern, or an etching pattern formed by etching the resist pattern. In the present embodiment, the wafer pattern to be measured is a resist pattern.

The exposure apparatus 10 includes a temperature measuring unit 18. The temperature measuring unit 18 measures the wafer temperature upon transferring the wafer pattern on the wafer WA. The temperature measuring unit 18 transmits the wafer temperature upon the transfer (exposure) of the lower pattern on the wafer WA to the imaging apparatus 1 as a lower-layer exposure temperature T-EU. The temperature measuring unit 18 transmits the wafer temperature upon the transfer (exposure) of the upper pattern on the wafer WA to the imaging apparatus 1 as an upper-layer exposure temperature T-ET.

The imaging apparatus 1 includes a temperature input unit 2A, a design data input unit 2B, an expansion/contraction information storage unit 3, an image data acquiring unit 4, a positional displacement measuring unit 5, a correcting unit 6, an output unit 7, and a temperature measuring unit 8.

The temperature input unit 2A receives the lower-layer exposure temperature T-EU and the upper-layer exposure temperature T-ET from the temperature measuring unit 18 in the exposure apparatus 10. The temperature input unit 2A transmits the lower-layer exposure temperature T-EU and the upper-layer exposure temperature T-ET to the correcting unit 6.

The design data input unit 2B receives design data (GDS) of a wafer pattern from a design data generating apparatus (not illustrated). The design data includes design data of an alignment mark, and design data of a body pattern (circuit pattern). The alignment mark is used for measuring the overlay displacement amount, while the body pattern is a subject whose overlay displacement amount is to be measured.

The design data input unit 2B receives design data of the lower pattern (lower design data) and design data of the upper pattern (upper design data) as the design data. The design data input unit 2B transmits the design data to the positional displacement measuring unit 5.

Figure 2:
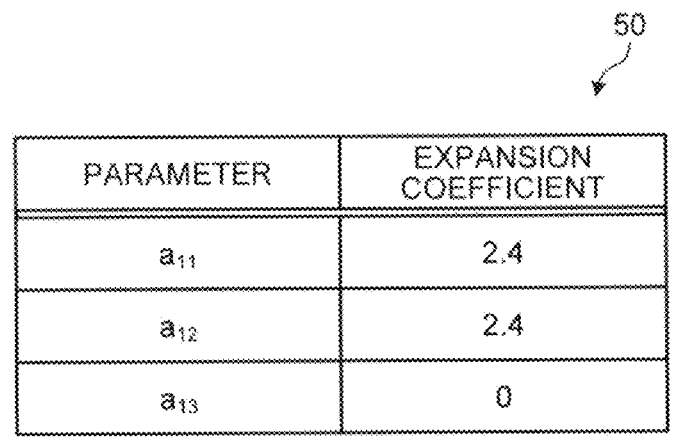
FIG. 2 is a view illustrating expansion coefficient information.

The expansion/contraction information storage unit 3 is a memory that stores a ratio of expansion and contraction (expansion coefficient) according to the temperature change. FIG. 2 is a view illustrating expansion coefficient information. In the expansion coefficient information 50, an expansion coefficient indicating how much nanometers in a wafer region of 1 mm² is changed when the wafer temperature rises by 1° C., and a parameter (an expansion parameter in a finite element method) are associated with each other. The present embodiment illustrates the expansion coefficient when the expansion caused by the temperature change is supposed to have isotropy. The expansion coefficient is an expansion coefficient of Si (silicon), for example.

A parameter $a_{11}$ in FIG. 2 is the expansion coefficient in an X direction, while a parameter $a_{12}$ is an expansion coefficient in a Y direction. A parameter $a_{13}$ is an expansion coefficient in a shearing direction. For example, the parameter $a_{11}$ and the parameter $a_{12}$ are 2.4 (nm/(mm²/° C.), and the parameter $a_{13}$ is 0.

The image data acquiring unit 4 captures an image of the wafer pattern by using an electron beam. The image data acquiring unit 4 transmits the image data to the positional displacement measuring unit 5.

The positional displacement measuring unit 5 measures a positional displacement amount (first positional displacement amount) between the alignment mark formed on the wafer WA and the design data of this alignment mark. The positional displacement measuring unit 5 measures the first positional displacement amount by using the image data of the alignment mark. The positional displacement measuring unit 5 measures the first positional displacement amount for each of the lower pattern and the upper pattern.

The positional displacement measuring unit 5 measures a positional displacement amount (second positional displacement amount) between the body pattern formed on the wafer WA and the design data of this body pattern. The positional displacement measuring unit 5 measures the second positional displacement amount by using the image data of the body pattern. The positional displacement measuring unit 5 measures the second positional displacement amount for each of the lower pattern and the upper pattern.

In the description below, the first positional displacement amount of the lower pattern is defined as the first positional displacement amount OL-1U, and the first positional displacement amount of the upper pattern is defined as the first positional displacement amount OL-1T. The second positional displacement amount of the lower pattern is defined as the second positional displacement amount OL-2U, and the second positional displacement amount of the upper pattern is defined as the second positional displacement amount OL-2T.

The positional displacement measuring unit 5 measures the first positional displacement amount OL-1U and the second positional displacement amount OL-2U of the lower pattern after the lower pattern is formed on the wafer WA and before other films or patterns are formed on the lower pattern.

The positional displacement measuring unit 5 also measures the first positional displacement amount OL-1T and the second positional displacement amount OL-2T of the upper pattern after the upper pattern is formed on the wafer WA and before other films or patterns are formed on the upper pattern.

The positional displacement measuring unit 5 calculates a positional displacement amount (hereinafter referred to as a third positional displacement amount OL-3U of the lower pattern) between the alignment mark (lower alignment mark) and the body pattern (lower body pattern) on the lower pattern based upon the first positional displacement amount OL-1U and the second positional displacement amount OL-2U of the lower pattern.

The positional displacement measuring unit 5 also calculates a positional displacement amount (hereinafter referred to as a third positional displacement amount OL-3T of the upper pattern) between the alignment mark (upper alignment mark) and the body pattern (upper body pattern) on the upper pattern based upon the first positional displacement amount OL-1T and the second positional displacement amount OL-2T of the upper pattern.

The positional displacement measuring unit 5 transmits the calculated third positional displacement amount OL-3U of the lower pattern and the third positional displacement amount OL-3T of the upper pattern to the correcting unit 6.

The temperature measuring unit 8 measures the wafer temperature (lower-layer measurement temperature T-MU) upon measuring the first positional displacement amount OL-1U and the second positional displacement amount OL-2U of the lower pattern. The temperature measuring unit 8 measures the wafer temperature (upper-layer measurement temperature T-MT) upon measuring the first positional displacement amount OL-1T and the second positional displacement amount OL-2T of the upper pattern. The temperature measuring unit 8 transmits the lower-layer measurement temperature T-MU and the upper-layer measurement temperature T-MT to the correcting unit 6.

The correcting unit 6 reads the expansion coefficient information 50 from the expansion/contraction information storage unit 3. The correcting unit 6 obtains the expansion/contraction amount of the wafer WA by using the finite element method. Specifically, the correcting unit 6 calculates the expansion/contraction amount of the wafer pattern between the exposure of the lower layer and the measurement of the positional displacement amount of the lower layer, based upon the lower-layer exposure temperature T-EU, the lower-layer measurement temperature T-MU, and the expansion coefficient information 50. The correcting unit 6 corrects the third positional displacement amount OL-3U of the lower pattern to the positional displacement amount (hereinafter referred to as a corrected positional displacement amount U of lower layer) according to the wafer temperature based upon the expansion/contraction amount of the wafer pattern.

Thus, the measurement error of the positional displacement amount between the lower alignment mark and the body pattern, caused by the thermal expansion of the upper pattern, is corrected. The correcting unit 6 outputs the corrected positional displacement amount U of lower layer to the output unit 7.

The correcting unit 6 calculates the expansion/contraction amount of the wafer pattern between the exposure of the upper layer and the measurement of the positional displacement amount of the upper layer, based upon the upper-layer exposure temperature T-ET, the upper-layer measurement temperature T-MT, and the expansion coefficient information 50. The correcting unit 6 corrects the third positional displacement amount OL-3T of the upper pattern to the positional displacement amount (hereinafter referred to as a corrected positional displacement amount T of upper layer) according to the wafer temperature based upon the expansion/contraction amount of the wafer pattern.

Thus, the measurement error of the positional displacement amount between the upper alignment mark and the body pattern, caused by the thermal expansion of the lower pattern, is corrected. The correcting unit 6 outputs the corrected positional displacement amount T of upper layer to the output unit 7.

The output unit 7 superimposes the corrected positional displacement amount U of lower layer and the corrected positional displacement amount T of upper layer, and transmits the resultant to the overlay displacement amount measuring apparatus 20.

The overlay displacement amount measuring apparatus 20 is an optical measuring apparatus, and measures the overlay displacement amount between the lower pattern and the upper pattern formed on the wafer WA. The overlay displacement amount measuring apparatus 20 measures the overlay displacement amount between the lower alignment mark and the upper alignment mark. The overlay displacement amount measuring apparatus 20 corrects the measured overlay displacement amount by using the corrected positional displacement amount U of lower layer and the corrected positional displacement amount T of upper layer.

Figure 3:
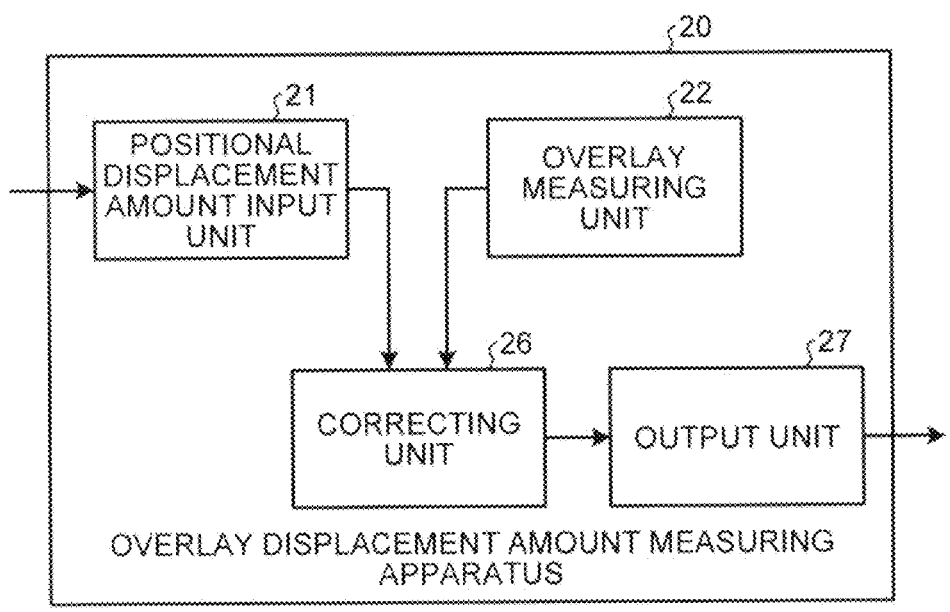
FIG. 3 is a block diagram illustrating a configuration of an overlay displacement amount measuring apparatus.

FIG. 3 is a block diagram illustrating a configuration of the overlay displacement amount measuring apparatus. The overlay displacement amount measuring apparatus 20 includes a positional displacement amount input unit 21, an overlay measuring unit 22, a correcting unit 26, and an output unit 27.

The positional displacement amount input unit 21 receives the corrected positional displacement amount U of lower layer and the corrected positional displacement amount T of upper layer from the imaging apparatus 1. The positional displacement amount input unit 21 transmits the corrected positional displacement amount U of lower layer and the corrected positional displacement amount T of upper layer to the correcting unit 26.

The overlay measuring unit 22 measures the overlay displacement amount between the lower alignment mark and the upper alignment mark. The overlay measuring unit 22 transmits the measurement result to the correcting unit 26 as an overlay displacement amount UT.

The correcting unit 26 corrects the overlay displacement amount UT by using the corrected positional displacement amount U of lower layer and the corrected positional displacement amount T of upper layer. The overlay displacement amount UT measured by the overlay measuring unit 22 is the overlay displacement amount between the alignment mark on the upper layer and the alignment mark on the lower layer. On the other hand, the corrected positional displacement amount U of lower layer and the corrected positional displacement amount T of upper layer are the positional displacement amount between the alignment mark and the body pattern.

Therefore, an overlay displacement amount X between the lower body pattern and the upper body pattern is calculated by correcting the overlay displacement amount UT by use of the corrected positional displacement amount U of lower layer and the corrected positional displacement amount T of upper layer.

FIG. 4 is a view illustrating an example of the structure of the alignment mark on the lower layer and the structure of the alignment mark on the upper layer. FIG. 4 illustrates a top view of a lower alignment mark 11A and an upper alignment mark 11B.

The lower alignment mark 11A is formed by using two line patterns extending in the X direction and two line patterns extending in the Y direction, for example. Each line pattern is arranged on each side of a rectangular region. In other words, in the lower alignment mark 11A, a first rectangular annular region is formed by first to fourth lower line patterns.

The upper alignment mark 11B is formed by using two line patterns extending in the X direction and two line patterns extending in the Y direction, for example. Each line pattern is arranged on each side of a rectangular region. In other words, in the upper alignment mark 11B, a second rectangular annular region is formed by first to fourth upper line patterns.

The first rectangular annular region using the lower alignment mark 11A is arranged to enclose the second rectangular annular region using the upper alignment mark 11B. In other words, the annular line formed by using the upper alignment mark 11B is arranged inside the annular line formed by using the lower alignment mark 11A.

The correcting unit 26 transmits the overlay displacement amount X between the upper body pattern and the lower body pattern to the output unit 27. The output unit 27 outputs the overlay displacement amount X between the body patterns to an external apparatus (such as a display apparatus).

Figure 5A:
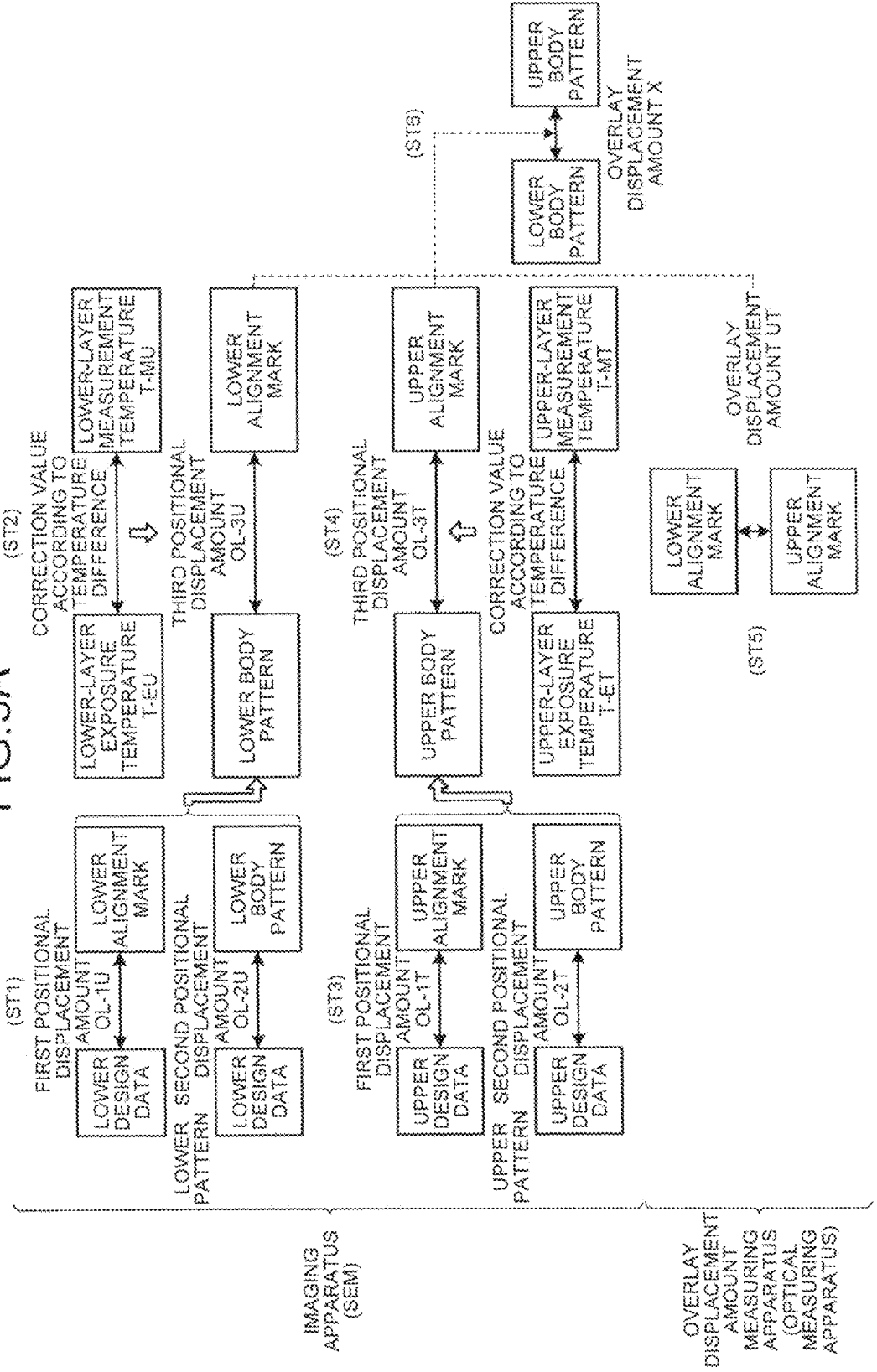
FIG. 5A is a view for describing a concept of an overlay displacement amount measuring process according to the embodiment.

FIG. 5A is a view for describing a concept of an overlay displacement amount measuring process according to the embodiment.

(ST1)

The imaging apparatus 1 (such as SEM) measures the first positional displacement amount OL-1U between the lower design data and the lower alignment mark 11A on the lower pattern. Similarly, the imaging apparatus 1 measures the second positional displacement amount OL-2U between the lower design data and the lower body pattern on the lower pattern.

FIG. 5B is a view for describing a concept of a positional displacement amount measuring process between the wafer pattern and the design data. The alignment mark 11X (the lower alignment mark 11A or the upper alignment mark 11B) and the body pattern 12 (the lower body pattern or the upper body pattern) are formed on the wafer WA as a wafer pattern 61.

The imaging apparatus 1 measures the first positional displacement amount between design data 62 and the alignment mark 11X. Similarly, the imaging apparatus 1 measures the second positional displacement amount between the design data 62 and the body pattern 12. In this case, the first positional displacement amount OL-1U and the second positional displacement amount OL-2U of the lower pattern are measured.

(ST2)

Thereafter, the third positional displacement amount OL-3U between the lower alignment mark 11A and the lower body pattern is calculated based upon the first positional displacement amount OL-1U and the second positional displacement amount OL-2U. The correction value (positional displacement amount correction value) according to the temperature difference between the lower-layer exposure temperature T-EU upon the exposure of the lower pattern and the lower-layer measurement temperature T-MU upon the measurement of the first positional displacement amounts OL-1U and the second positional displacement amounts OL-2U of the lower pattern are calculated.

The third positional displacement amount OL-3U is corrected by using the calculated positional displacement amount correction value.

(ST3)

The imaging apparatus 1 (such as SEM) measures the first positional displacement amount OL-1T between the upper design data and the upper alignment mark 11B on the upper pattern. Similarly, the imaging apparatus 1 measures the second positional displacement amount OL-2T between the upper design data and the upper body pattern of the upper pattern.

(ST4)

Thereafter, the third positional displacement amount OL-3T between the upper alignment mark 11B and the upper body pattern is calculated based upon the first positional displacement amount OL-1T and the second positional displacement amount OL-2T.

The correction value (positional displacement amount correction value) according to the temperature difference between the upper-layer exposure temperature T-ET upon the exposure of the upper pattern and the upper-layer measurement temperature T-MT upon the measurement of the first positional displacement amount OL-1T and the second positional displacement amount OL-2T of the upper pattern is calculated. The third positional displacement amount OL-3T is corrected by using the calculated positional displacement amount correction value.

(ST5)

The overlay displacement amount measuring apparatus 20 (optical measuring apparatus) measures the overlay displacement amount UT between the lower alignment mark 11A and the upper alignment mark 11B.

(ST6)

The overlay displacement amount X between the lower body pattern and the upper body pattern is calculated based upon the corrected positional displacement amount U of lower layer, the corrected positional displacement amount T of upper layer, and the overlay displacement amount UT.

Figure 6:
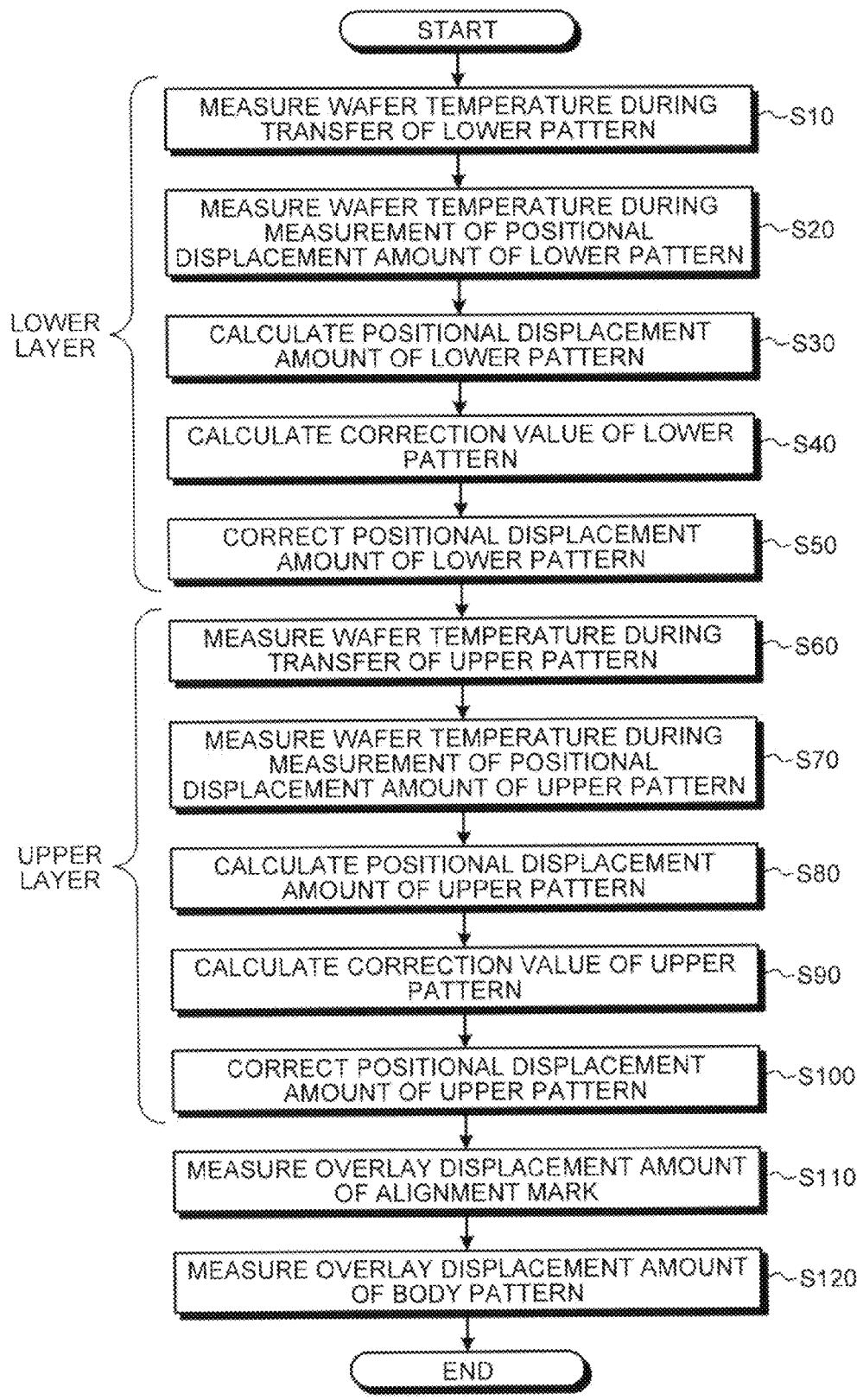
FIG. 6 is a flowchart illustrating a procedure of the overlay displacement amount measuring process according to the embodiment.

FIG. 6 is a flowchart illustrating a procedure of the overlay displacement amount measuring process according to the embodiment. In order to form a semiconductor device on the wafer WA, the lower pattern is formed on the wafer WA, and then, the upper layer is formed on the wafer WA.

The exposure apparatus 10 transfers the lower pattern on the wafer WA. The temperature measuring unit 18 measures the wafer temperature upon the transfer (exposure) of the lower pattern upon the wafer WA (step S10). The temperature measuring unit 18 transmits the measurement result to the temperature input unit 2A in the imaging apparatus 1 as the lower-layer exposure temperature T-EU.

The temperature input unit 2A transmits the lower-layer exposure temperature T-EU to the correcting unit 6. The lower design data and the upper design data are inputted to the design data input unit 2B as the design data for the wafer pattern. The design data input unit 2B transmits the lower design data and the upper design data to the positional displacement measuring unit 5.

The image data acquiring unit 4 captures the image of the lower alignment mark 11A and the lower body pattern, which are the wafer pattern. The image data acquiring unit 4 transmits the image data to the positional displacement measuring unit 5.

The temperature measuring unit 8 measures the wafer temperature upon measuring the first and second positional displacement amounts of the lower pattern as the lower-layer measurement temperature T-MU (step S20). The temperature measuring unit 8 transmits the lower-layer measurement temperature T-MU to the correcting unit 6.

The positional displacement measuring unit 5 measures the first positional displacement amount OL-1U between the image data of the lower alignment mark 11A and the design data of the lower alignment mark 11A. The positional displacement measuring unit 5 also measures the second positional displacement amount OL-2U between the image data of the lower body pattern and the design data of the lower body pattern.

The positional displacement measuring unit 5 calculates the third positional displacement amount OL-3U between the lower alignment mark 11A and the lower body pattern based upon the first positional displacement amount OL-1U and the second positional displacement amount OL-2U of the lower pattern (step S30). The positional displacement measuring unit 5 transmits the calculated third positional displacement amount OL-3U of the lower pattern to the correcting unit 6.

The correcting unit 6 reads the expansion coefficient information 50 from the expansion/contraction information storage unit 3. The correcting unit 6 corrects the third positional displacement amount OL-3U of the lower pattern based upon the lower-layer exposure temperature T-EU, the lower-layer measurement temperature T-MU, and the expansion coefficient information 50. The correcting unit 6 corrects the third positional displacement amount OL-3U of the lower pattern according to temperature difference between the lower-layer exposure temperature T-EU and the lower-layer measurement temperature T-MU.

Figure 7:
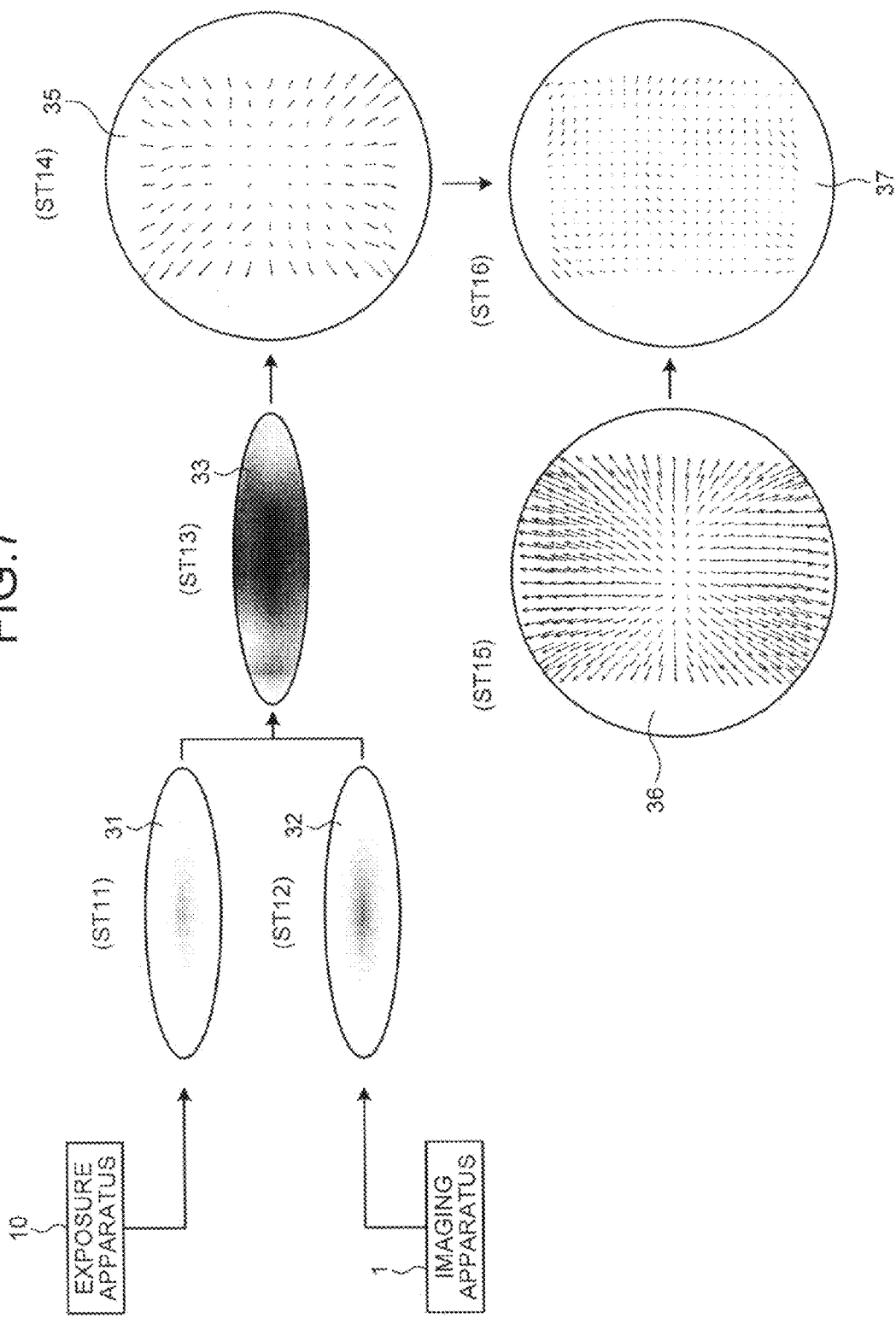
FIG. 7 is a view for describing a correcting process of the positional displacement amount according to a temperature difference between a wafer temperature during an exposure and a wafer temperature during the measurement of the positional displacement amount.

FIG. 7 is a view for describing a correcting process of the positional displacement amount according to the temperature difference between the wafer temperature during the exposure and the wafer temperature during the measurement of the positional displacement amount. The correcting process of the positional displacement amount according to the temperature difference is carried out for the lower pattern and for the upper pattern. The process of correcting the positional displacement amount for the lower pattern and the process of correcting the positional displacement amount for the upper pattern are the same. Therefore, the process of correcting the positional displacement for the lower pattern will be described here.

The temperature measuring unit 18 in the exposure apparatus 10 acquires the lower-layer exposure temperature T-EU, which is the wafer temperature upon the exposure, as a temperature distribution 31 on the wafer WA (ST11). The temperature measuring unit 8 in the imaging apparatus 1 acquires the lower-layer measurement temperature T-MU, which is the wafer temperature during the measurement of the positional displacement amount, as a temperature distribution 32 on the wafer WA (ST12).

The correcting unit 6 calculates the temperature difference between the lower-layer exposure temperature T-EU and the lower-layer measurement temperature T-MU as a temperature distribution 33 on the wafer WA (ST13).

Figure 8:
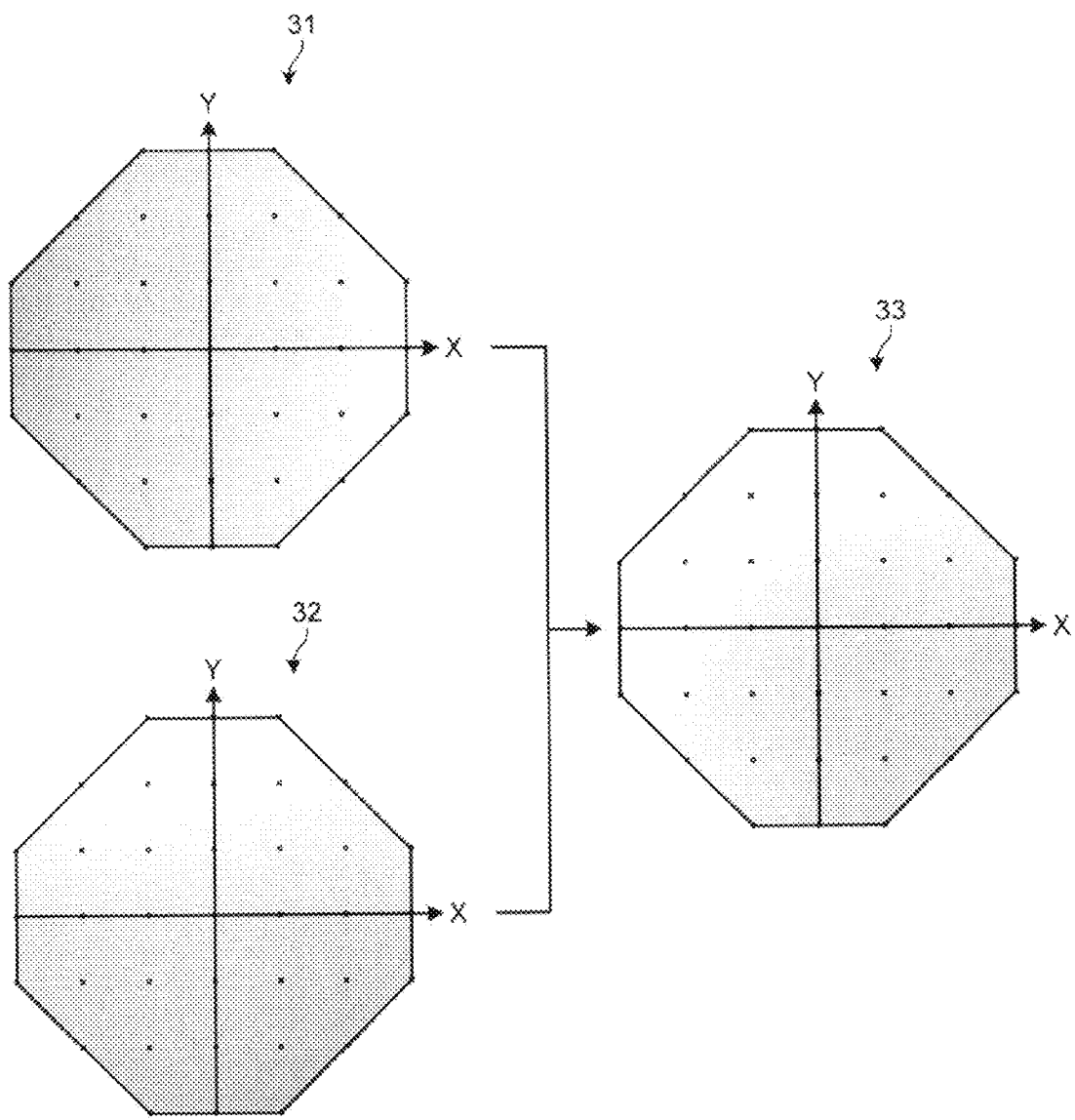
FIG. 8 is a view for describing a temperature difference between a temperature during an exposure of a lower layer and a temperature during a measurement of the lower layer.

FIG. 8 is a view for describing the temperature difference between the temperature during the exposure of the lower layer and the temperature during the measurement of the lower layer. The temperature distribution 31 illustrated in FIG. 8 is one example of the lower-layer exposure temperature T-EU, while the temperature distribution 32 is one example of the lower-layer measurement temperature T-MU. The correcting unit 6 calculates the temperature distribution 33 that is one example of the temperature difference distribution between the temperature during the exposure of the lower layer and the temperature during the measurement of the lower layer based upon the temperature distributions 31 and 32 illustrated in FIG. 8.

The correcting unit 6 calculates (estimates) the expansion/contraction size map 35 on the wafer WA based upon the temperature distribution 33 and the expansion coefficient information 50 (ST14). The expansion/contraction size map 35 indicates the distribution of the expansion/contraction amount of the wafer pattern (the positional displacement predicted distribution on the wafer WA). The correcting unit 6 may calculate the wafer temperature or the expansion/contraction amount of the portion other than the position where the wafer temperature is measured, according to an interpolation process.

Figure 9:
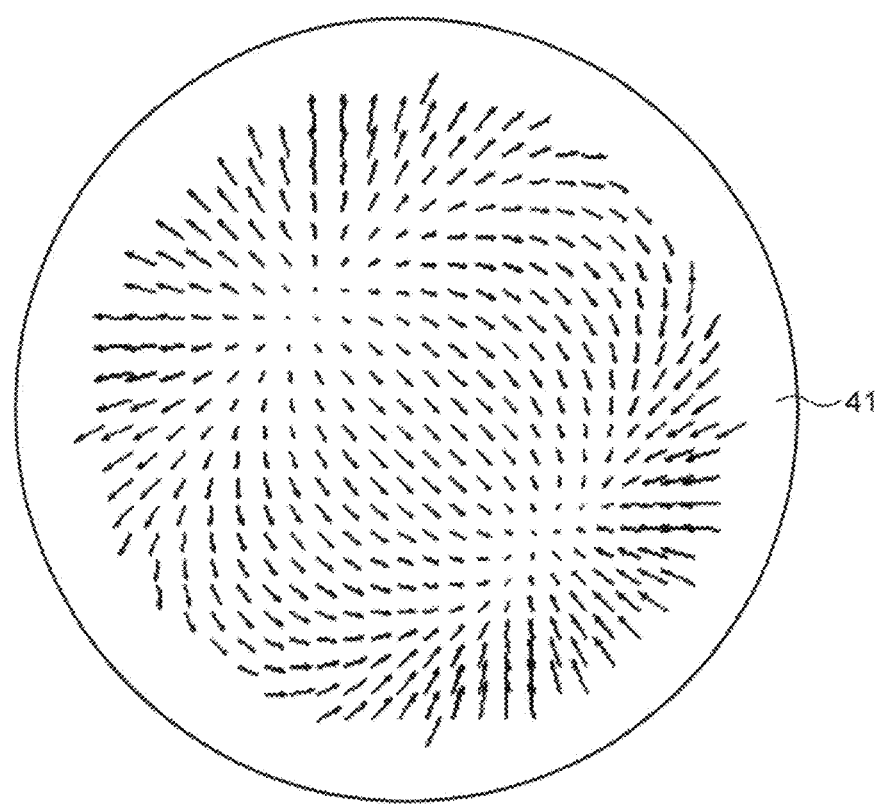
FIG. 9 is a view illustrating one example of an expansion/contraction size map calculated by an interpolation process.

FIG. 9 is a view illustrating one example of the expansion/contraction size map calculated by the interpolation process. FIG. 9 illustrates the detailed expansion/contraction size map 41. The expansion/contraction size map 41 is derived by carrying out the interpolation process to the expansion/contraction size map 35.

The expansion/contraction size map 35 (the expansion/contraction size map 41) indicates the difference between the distance between the patterns on the wafer pattern formed during the exposure and the distance between the patterns formed on the wafer pattern during the measurement of the positional displacement amount, and is used as the correction value for correcting the positional displacement amount OL-3U of the lower pattern (step S40). Arrows in the expansion/contraction size map 35 in FIG. 7 are vectors indicating the expansion and contraction (size and direction) of the wafer pattern.

Since the lower alignment mark 11A and the lower body pattern are apart from each other by a predetermined or longer distance on the wafer WA, a difference not less than a predetermined value is generated between the patterns due to the expansion and contraction of the wafer WA. Therefore, an error is generated in the distance between the lower alignment mark 11A and the lower body pattern by the distance according to the temperature difference between the wafer temperature during the exposure and the wafer temperature during the measurement of the positional displacement amount.

In the present embodiment, the correcting unit 6 calculates the expansion/contraction size map 35 of the wafer WA, and corrects the third positional displacement amount OL-3U of the lower pattern by using the expansion/contraction size map 35 of the wafer WA (step S50). In FIG. 7, the third positional displacement amount OL-3U of the lower pattern is indicated as a positional displacement amount map 36 on the wafer WA (ST15). Arrows in the positional displacement amount map 36 are vectors indicating the positional displacement amount and positional displacement direction.

The correcting unit 6 calculates the corrected positional displacement amount U of lower layer by correcting the positional displacement amount map 36 by using the expansion/contraction size map 35 (ST16). In FIG. 7, the corrected positional displacement amount U of lower layer is indicated as a temperature position displacement map 37 on the wafer WA. Arrows in the temperature position displacement map 37 are vectors indicating the positional displacement amount and positional displacement direction.

The correcting unit 6 outputs the corrected positional displacement amount U of lower layer (temperature position displacement map 37) to the output unit 7. The output unit 7 transmits the corrected positional displacement amount U of lower layer to the overlay displacement amount measuring apparatus 20.

After the lower pattern is formed, the upper pattern is formed. Specifically, the exposure apparatus 10 transfers the upper pattern on the wafer WA. The third positional displacement amount OL-3T of the upper pattern is corrected by the process similar to the process for the lower pattern.

Specifically, the temperature measuring unit 18 measures the wafer temperature during the transfer (exposure) of the upper pattern on the wafer WA (step S60), and transmits the measurement result to the temperature input unit 2A as the upper-layer exposure temperature T-ET.

The image data acquiring unit 4 captures the image of the upper alignment mark 11B and the upper body pattern, which are the wafer pattern. The temperature measuring unit 8 measures the upper-layer measurement temperature T-MT as the wafer temperature upon the measurement of the first positional displacement amount OL-1T and the second positional displacement amount OL-2T of the upper pattern (step S70).

The positional displacement measuring unit 5 measures the first positional displacement amount OL-1T between the image data of the upper alignment mark 11B and the design data of the upper alignment mark 11B. The positional displacement measuring unit 5 also measures the second positional displacement amount OL-2T between the image data of the upper body pattern and the design data of the upper body pattern.

The positional displacement measuring unit 5 calculates the third positional displacement amount OL-3T between the upper alignment mark 11B and the upper body pattern based upon the first positional displacement amount OL-1T and the second positional displacement amount OL-2T of the upper pattern (step S80).

The correcting unit 6 corrects the third positional displacement amount OL-3T of the upper pattern based upon the upper-layer exposure temperature T-ET, the upper-layer measurement temperature T-MT, and the expansion coefficient information 50. The correcting unit 6 corrects the third positional displacement amount OL-3T of the upper pattern according to the temperature difference between the upper-layer exposure temperature T-ET and the upper-layer measurement temperature T-MT.

In this case, the correcting unit 6 calculates a correction value (expansion/contraction size map 35 of the upper pattern) for correcting the positional displacement of the lower pattern by the process similar to the process for the upper pattern (step S90).

The correcting unit 6 corrects the third positional displacement amount OL-3T of the upper pattern by using the expansion/contraction size map 35 of the wafer WA (step S100). The correcting unit 6 outputs the corrected positional displacement amount T of upper layer (temperature position displacement map 37 of the upper layer) to the output unit 7. The output unit 7 transmits the corrected positional displacement amount T of upper layer to the overlay displacement amount measuring apparatus 20.

The overlay measuring unit 22 in the overlay displacement amount measuring apparatus 20 measures the overlay displacement amount UT between the lower alignment mark and the upper alignment mark (step S110).

The correcting unit 26 corrects the overlay displacement amount UT by using the corrected positional displacement amount U of lower layer and the corrected positional displacement amount T of upper layer. Thus, the overlay displacement amount X between the lower body pattern and the upper body pattern is measured (step S120).

Figure 10:
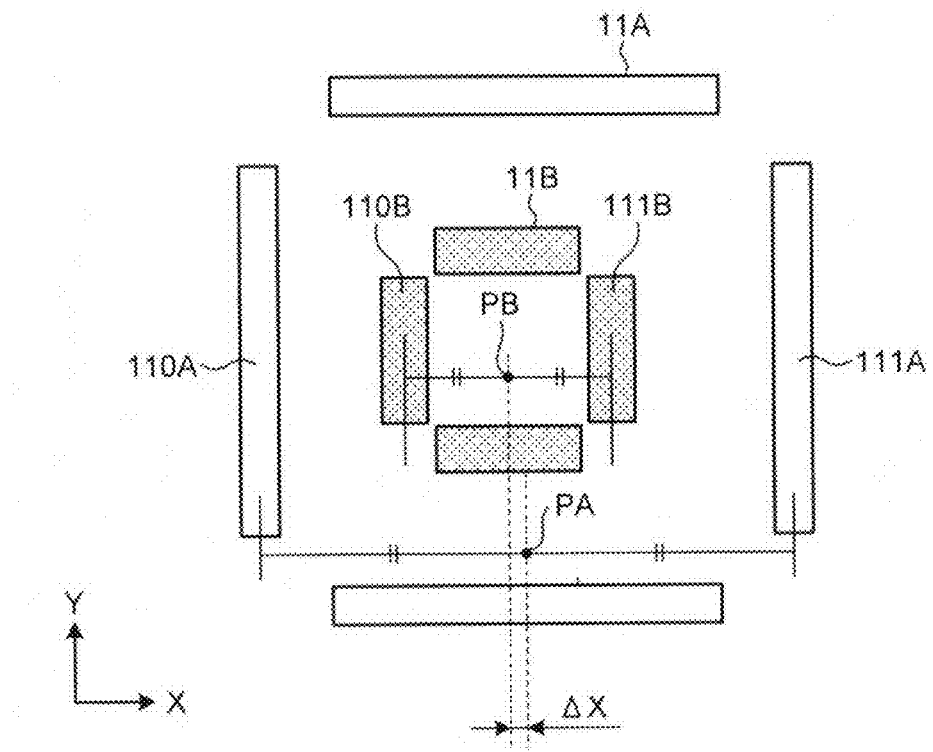
FIG. 10 is a view for describing an overlay displacement amount between alignment marks.

FIG. 10 is a view for describing the overlay displacement amount between alignment marks. The process of measuring the overlay displacement amount between the alignment marks by using the lower alignment mark 11A and the upper alignment mark 11B illustrated in FIG. 4 will be described.

A position of center of gravity of the lower alignment mark 11A in the X direction is calculated as a position of center of gravity PA of two line patterns 110A and 111A, extending in the Y direction, of the lower alignment mark 11A.

A position of center of gravity of the upper alignment mark 11B in the X direction is calculated as a position of center of gravity PB of two line patterns 110B and 111B, extending in the Y direction, of the upper alignment mark 11B.

The distance between the position of center of gravity PA of the lower alignment mark 11A and the position of center of gravity PB of the upper alignment mark 11B is calculated as the overlay displacement amount ΔX in the X direction between the alignment marks.

Similarly, the overlay displacement amount between the alignment marks in the Y direction is calculated by using the position of center of gravity of two line patterns, extending in the X direction, of the lower alignment mark 11A and the position of center of gravity of two line patterns, extending in the X direction, of the upper alignment mark 11B.

The positional displacement amount OL-3U of the lower pattern and the positional displacement amount OL-3T of the upper pattern may be measured respectively by different imaging apparatuses 1. The lower pattern and the upper pattern may be formed respectively by different exposure apparatuses 10.

As described above, according to the present embodiment, the positional displacement amount between the alignment mark and the body pattern is corrected based upon the wafer temperature during the exposure and the wafer temperature during the measurement of the positional displacement, whereby the influence caused by the thermal expansion of the wafer WA can be corrected. Accordingly, the overlay displacement amount between the upper layer and the lower layer can correctly be measured.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An overlay displacement amount measuring method comprising:

measuring a first temperature distribution of a substrate during a first process that is a process of forming a first pattern on the substrate;

measuring a first positional displacement amount between the first patterns by a first electron microscope;

measuring a second temperature distribution of the substrate during a second process that is a process of measuring the first positional displacement amount;

calculating a first expansion/contraction amount of the substrate between the first process and the second process based upon the first temperature distribution and the second temperature distribution;

correcting the first positional displacement amount based upon the first expansion/contraction amount;

measuring an overlay displacement amount between the first pattern and a second pattern formed on a layer different from the first pattern by a first optical measuring apparatus; and correcting the overlay displacement amount based upon the corrected first positional displacement amount.

2. The overlay displacement amount measuring method according to claim 1, further comprising:

measuring a third temperature distribution of the substrate during a third process that is a process of forming the second pattern on the substrate;

measuring a second positional displacement amount between the second patterns by a second electron microscope;

measuring a fourth temperature distribution of the substrate during a fourth process that is a process of measuring the second positional displacement amount;

calculating a second expansion/contraction amount of the substrate between the third process and the fourth process based upon the third temperature distribution and the fourth temperature distribution;

correcting the second positional displacement amount based upon the second expansion/contraction amount;

when the overlay displacement amount is measured, measuring an overlay displacement amount between the first pattern and the second pattern by a second optical measuring apparatus; and correcting the overlay displacement amount based upon the corrected first and second positional displacement amounts.

3. The overlay displacement amount measuring method according to claim 1, wherein the first process is an exposure process, and the first pattern is a resist pattern.

4. The overlay displacement amount measuring method according to claim 1, wherein the first pattern includes a first alignment mark used for measuring the overlay displacement amount and a first pattern to be measured that is a subject to which the overlay displacement amount is to be measured, and the first positional displacement amount is a positional displacement amount between the first alignment mark and the first pattern to be measured.

5. The overlay displacement amount measuring method according to claim 4, wherein when the first positional displacement amount is measured, a third positional displacement amount between the first alignment mark and design data of the first alignment mark is measured, a fourth positional displacement amount between the first pattern to be measured and design data of the first pattern to be measured is measured, and the first positional displacement amount is calculated based upon the third and fourth positional displacement amounts.

6. The overlay displacement amount measuring method according to claim 2, wherein the third process is an exposure process, and the second pattern is a resist pattern.

7. The overlay displacement amount measuring method according to claim 2, wherein the second pattern includes a second alignment mark used for measuring the overlay displacement amount and a second pattern to be measured that is a subject to which the overlay displacement amount is to be measured, and the second positional displacement amount is a positional displacement amount between the second alignment mark and the second pattern to be measured.

8. The overlay displacement amount measuring method according to claim 7, wherein when the second positional displacement amount is measured, a fifth positional displacement amount between the second alignment mark and design data of the second alignment mark is measured, a sixth positional displacement amount between the second pattern to be measured and design data of the second pattern to be measured is measured, and the second positional displacement amount is calculated based upon the fifth and sixth positional displacement amounts.

9. The overlay displacement amount measuring method according to claim 2, wherein the first pattern includes the first alignment mark used for measuring the overlay displacement amount, the second pattern includes the second alignment mark used for measuring the overlay displacement amount, and when the overlay displacement amount is measured, the overlay displacement amount is measured between the first alignment mark and the second alignment mark.

10. The overlay displacement amount measuring method according to claim 1, wherein the first expansion/contraction amount is calculated based upon expansion/contraction information involved with a correspondence relation between a temperature difference of the substrate and an expansion/contraction amount of the substrate.

11. A positional displacement amount measuring method comprising:

measuring a first temperature distribution of a substrate during a first process that is a process of forming a pattern on the substrate;

measuring a first positional displacement amount between the first patterns by an electron microscope;

measuring a second temperature distribution of the substrate during a second process that is a process of measuring the first positional displacement amount;

calculating an expansion/contraction amount of the substrate between the first process and the second process based upon the first temperature distribution and the second temperature distribution; and correcting the first positional displacement amount based upon the expansion/contraction amount.

12. The positional displacement amount measuring method according to claim 11, wherein the first process is an exposure process, and the first pattern is a resist pattern.

13. The positional displacement amount measuring method according to claim 11, wherein the pattern includes an alignment mark used for measuring the overlay displacement amount and a pattern to be measured that is a subject to which the overlay displacement amount is to be measured, and the first positional displacement amount is a positional displacement amount between the alignment mark and the pattern to be measured.

14. The positional displacement amount measuring method according to claim 13, wherein when the first positional displacement amount is measured, a second positional displacement amount between the alignment mark and design data of the alignment mark is measured, a third positional displacement amount between the pattern to be measured and design data of the pattern to be measured is measured, and the first positional displacement amount is calculated based upon the second and third positional displacement amounts.

15. The positional displacement amount measuring method according to claim 11, wherein the expansion/contraction amount is calculated based upon expansion/contraction information involved with a correspondence relation between a temperature difference of the substrate and an expansion/contraction amount of the substrate.

* * * * *